(12) United States Patent
Roan et al.

(10) Patent No.: US 9,883,578 B1
(45) Date of Patent: Jan. 30, 2018

(54) COOLING CONDUCTIVE TRACE WITH PRESSURIZED AIR OR GAS (71) Applicant: Deere & Company, Moline, IL (US)

(72) Inventors: Thomas J. Roan, Fargo, ND (US); Brij N. Singh, West Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 0 days.

(21) Appl. No.: 15/386,234

(22) Filed: Dec. 21, 2016

(51) Int. Cl.
H05K 1/02 (2006.01)

(52) U.S. Cl.
CPC ......... *H05K 1/0201* (2013.01); *H05K 1/0272* (2013.01); *H05K 2201/06* (2013.01); *H05K 2201/064* (2013.01); *H05K 2201/09036* (2013.01)

(58) Field of Classification Search
CPC ............... H05K 1/0201; H05K 1/0272; H05K 2201/06; H05K 2201/064; H05K 2201/09036
USPC ........................................................ 174/252
See application file for complete search history.

(56) References Cited

U.S. PATENT DOCUMENTS

| | | | | |
|---|---|---|---|---|
| 2,983,506 A | * | 5/1961 | Bertsch | B60G 17/033 267/64.11 |
| 3,017,203 A | * | 1/1962 | MacLeod | F16L 31/00 285/256 |
| 3,427,714 A | * | 2/1969 | Lemelson | H05K 7/20345 174/252 |
| 3,695,642 A | * | 10/1972 | DeWoody | F16L 5/06 174/84 R |
| 5,712,607 A | | 1/1998 | Dittmer et al. | |
| 5,853,202 A | * | 12/1998 | Li | F16L 33/30 285/256 |
| 6,008,987 A | * | 12/1999 | Gale | H05K 1/0207 165/104.33 |
| 8,049,578 B1 | | 11/2011 | Albers et al. | |
| 8,354,594 B2 | * | 1/2013 | Wolfel | H05K 1/0272 174/252 |
| 9,312,589 B2 | | 4/2016 | Sherrer et al. | |
| 2008/0128158 A1 | * | 6/2008 | Wolfel | H05K 1/0272 174/252 |

* cited by examiner

Primary Examiner — Michael F. McAllister (57) ABSTRACT

An electrical assembly comprises a dielectric substrate and a metallic conductive trace overlying the substrate. The metallic conductive trace has a hollow cross-section that forms a duct. An annular member protrudes from the metallic conductive trace. The annular member has an opening in communication with the duct, the opening for receiving pressurized air or gas.

19 Claims, 8 Drawing Sheets

COOLING CONDUCTIVE TRACE WITH PRESSURIZED AIR OR GAS

FIELD

This disclosure relates to cooling a conductive trace with pressurized air or gas and, more particularly, a cooling conductive trace associated with a circuit board or substrate.

BACKGROUND

In the certain prior art, heavy-pour copper traces are used on circuit boards to keep trace resistances low and prevent overheating for high current applications, like power electronics for vehicles. The copper traces consume valuable metal resources and add extra weight to the power electronics. The size of heavy-pour copper traces may be based on engineering guidelines to allow for maximum allowed current density. High frequency current tends to flow at the surface or skin of the conductor or copper trace, which can increase resistance and contribute to additional thermal loading.

In some prior art, to keep temperature of the copper traces and circuit board under allowed maximum, external cooling is used. For example, external cooling may involve placing dielectric thermal interface materials in contact with the copper traces to transfer heat to a heat sink. External cooling of copper traces tends to increase the complexity, size, and cost of circuit boards in power electronic systems. Thus, there is need to cool traces without adding thermal interface materials and heat sink.

SUMMARY

In accordance with on embodiment, an electrical assembly comprises a dielectric substrate and a metallic conductive trace overlying the substrate. The metallic conductive trace has a hollow cross-section that forms a duct. An annular member protrudes from the metallic conductive trace. The annular member has an opening in communication with the duct, the opening for receiving pressurized air or gas.

DETAILED DESCRIPTION

Figure 1:
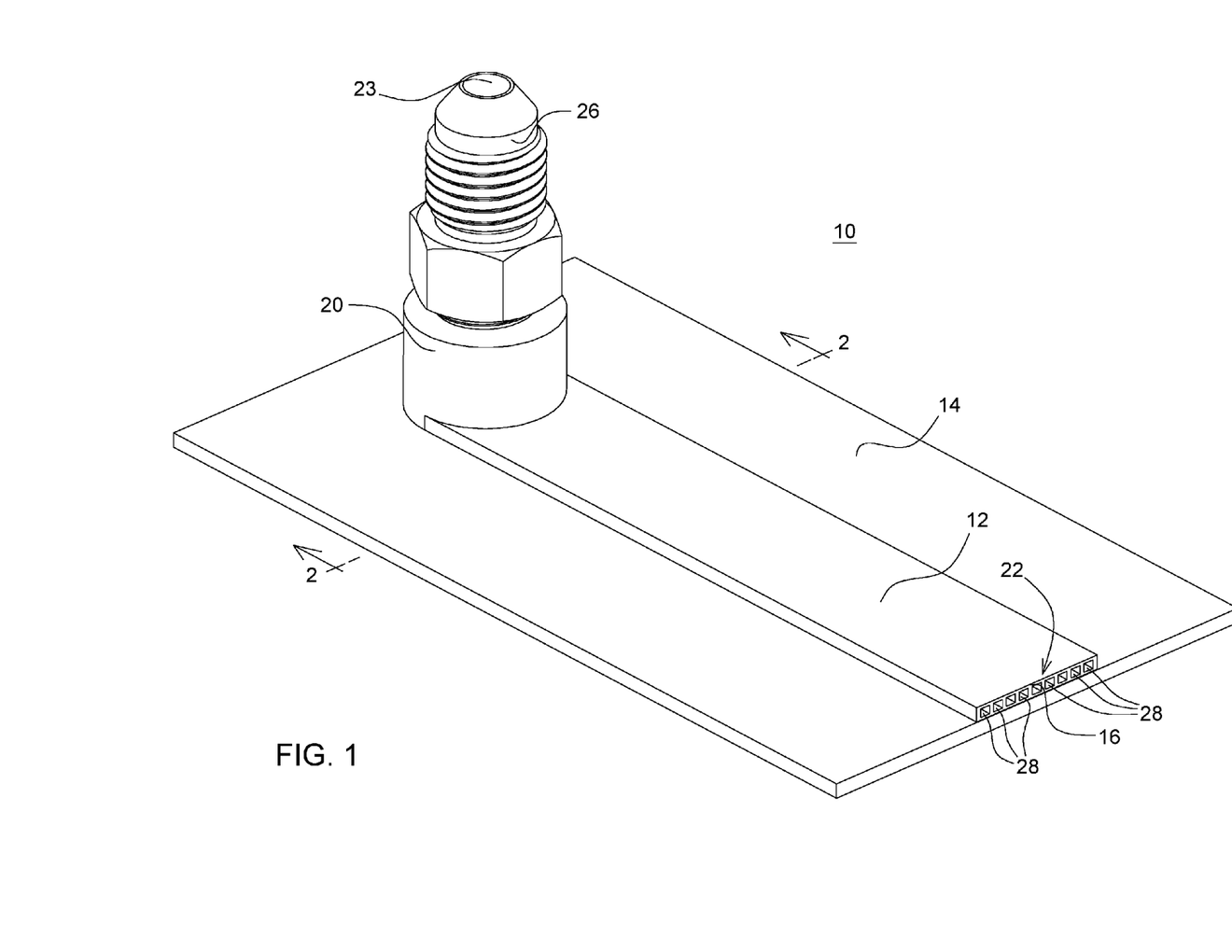
FIG. 1 is a perspective view of one embodiment of a conductive trace overlying a substrate.

FIG. 1 is a perspective view of one embodiment of a conductive trace 12 overlying a dielectric substrate 14. In accordance with one embodiment, an electrical assembly 10 comprises a dielectric substrate 14 and a metallic conductive trace 12 overlying the substrate 14 or a dielectric layer of a substrate (e.g., circuit board). The metallic conductive trace 12 has a cross-section 18 (e.g., hollow cross section in FIG. 2) that forms a duct 22 (e.g., air duct) or conduit suitable for conveying air, gas or a fluid (e.g., fluid in gas phase of matter). An annular member 20 protrudes from the metallic conductive trace 12, the dielectric substrate 14, or both. The annular member 20 has an opening 24 in communication with the duct 22. The opening 24 is arranged to receive compressed or pressurized air or gas (e.g., that is pressurized or compressed to a pressure greater than the ambient atmospheric pressure).

In one embodiment, the opening 24 of the annular member 20 has internal threads 40 for receiving an air hose or a coupler 26 (e.g., threaded coupler) for compressed air or compressed gas (e.g., nitrogen or carbon dioxide) from a compressor or tank of compressed air or gas. The coupler 26 (e.g., coupler) is connected to the annular member 20 and is adapted to receive compressed air or gas at an inlet port 23 from a hose, tube or pneumatic line that is connected to a compressor, a tank or other source of compressed air, gas or fluid.

In an alternate embodiment, instead of forced air or compressed air, a refrigeration system can be used with a compressor that provides compressed refrigerant (e.g., fluid) to the opening 24 or inlet 23 for circulation through the duct 22 or channels 28 (e.g., that function as a condenser) to an outlet of the channels 28 that is connected to an evaporator (e.g., evaporator coil) that returns the cooled refrigerant to the compressor, where refrigerant lines interconnect the compressor, the opening 24, the outlet, and the evaporator as a closed system for recycling the refrigerant.

The annular member 20 can be composed of a metal, a metal alloy, a plastic, a polymer, a metallic material, or a metallic outer coating or metallic sheath. The metallic member may have a cylindrical interior surface 21. In one embodiment, the coupler 26 is composed of a plastic, a polymer or a dielectric material to provide electrical isolation between the circuit trace 12 and the compressor or tank that provides air or gas to the opening 24. The opening 24 of the annular member 20 comprises a generally cylindrical hole that terminates at a surface of the dielectric substrate 14 (e.g., in an elliptical or circular region of the surface of the dielectric substrate 14). The duct 22 comprises a plurality of channels 28 that meet the opening 24 at a curved interior surface or the cylindrical interior surface 21 of the opening 24.

Figure 2:
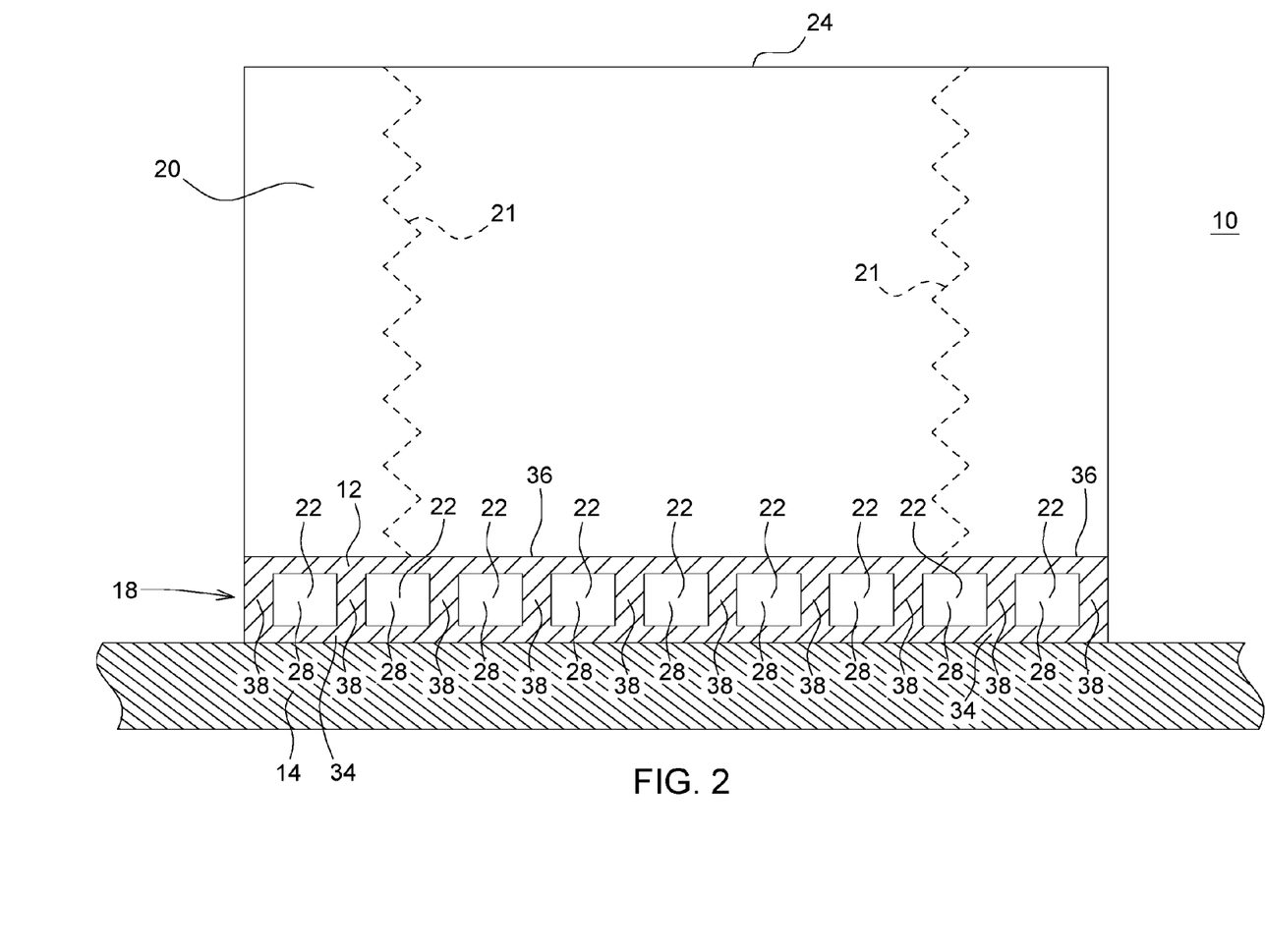
FIG. 2 is a cross-sectional view of the conductive trace along reference line 2-2 of FIG. 1.

FIG. 2 is a cross-sectional view of the conductive trace 12 along reference line 2-2 of FIG. 1. In the embodiment of FIG. 1 and FIG. 2, the hollow cross-section 18 comprises a metallic base wall 34 on the dielectric substrate 14, a plurality of side walls 38 extending vertically from the metallic base wall 34, and a cap wall 36 capping or intersecting the side walls 38. The duct 22 comprises a plurality of channels 28 that extend 16 longitudinally through the metallic conductive trace 12, where the channels 28 are generally parallel to each other. The channels 28 are capable of communicating the pressurized air or gas between the opening 24 and an opposite end 16 of the channels 28. In one embodiment, the channels 28 have a substantially rectangular cross section or a substantially polygonal cross section. In an alternate embodiment, the channels 28 have a substantially circular cross section or a substantially elliptical cross section.

In one embodiment, the substrate 14 comprises a circuit board where the circuit board has a multiple conductive traces 12 in accordance with this disclosure. Each conductive trace 12 may be fed by a separate opening 24 or inlet 23, for instance.

In an alternate embodiment, the end 16 or air output of one conductive trace 12 may be placed in series with another conductive trace 12 by a pneumatically connection between the end and the opening 24.

The conductive traces 12 with the interior coolant channels 28 can be made or formed by an additive manufacturing process, a subtractive manufacturing process, a combination of an additive manufacturing process and a subtractive manufacturing process, or by a three-dimensional printing process, for example.

An additive manufacturing process forms the conductive traces 12 with the channels 28 in multiple layers that are stacked or adjoin each other in a successive or iterative process. For example, an additive manufacturing process may include three-dimensional printing by a three-dimensional printer from a computer-aided-design (CAD) model or file that defines the conductive trace 12 and cooling channels 28. Successive layers of the electrical assembly (10, 110) can be printed and joined by bonding agents or adhesives, for instance. Other additive manufacturing processes can be used, such as photolithographic manufacturing processes. Photolithographic manufacturing processes can be used to cure a photosensitive polymer layer for addition to a substrate or circuit board by exposure to selective electromagnetic radiation (e.g., ultraviolet light in accordance with a target pattern or mask), whereas other portions that are not irradiated can be removed by subtractive manufacturing process, such as chemical etching, chemical treatment or ablation. Metal layers can be produced by metal sputtering, electroplating, or electroless deposition, for example.

In one embodiment, the duct 22 or coolant channels 28 convey forced cool air, nitrogen, carbon dioxide, or gas through the duct 22 from the opening 24 to an outlet at an opposite end 16, which may be discharged to ambient air pressure or collected in a tank for recycling, cooling and compression for reintroduction to the opening 24 or inlet. The flow of air, nitrogen or other gas through the duct 22 or channels 28 provides cooling directly to the conductive trace 12 or the high thermal flux areas of the circuit board without the weight or volume of heat sink, or other heat dissipating structures.

Figure 3:
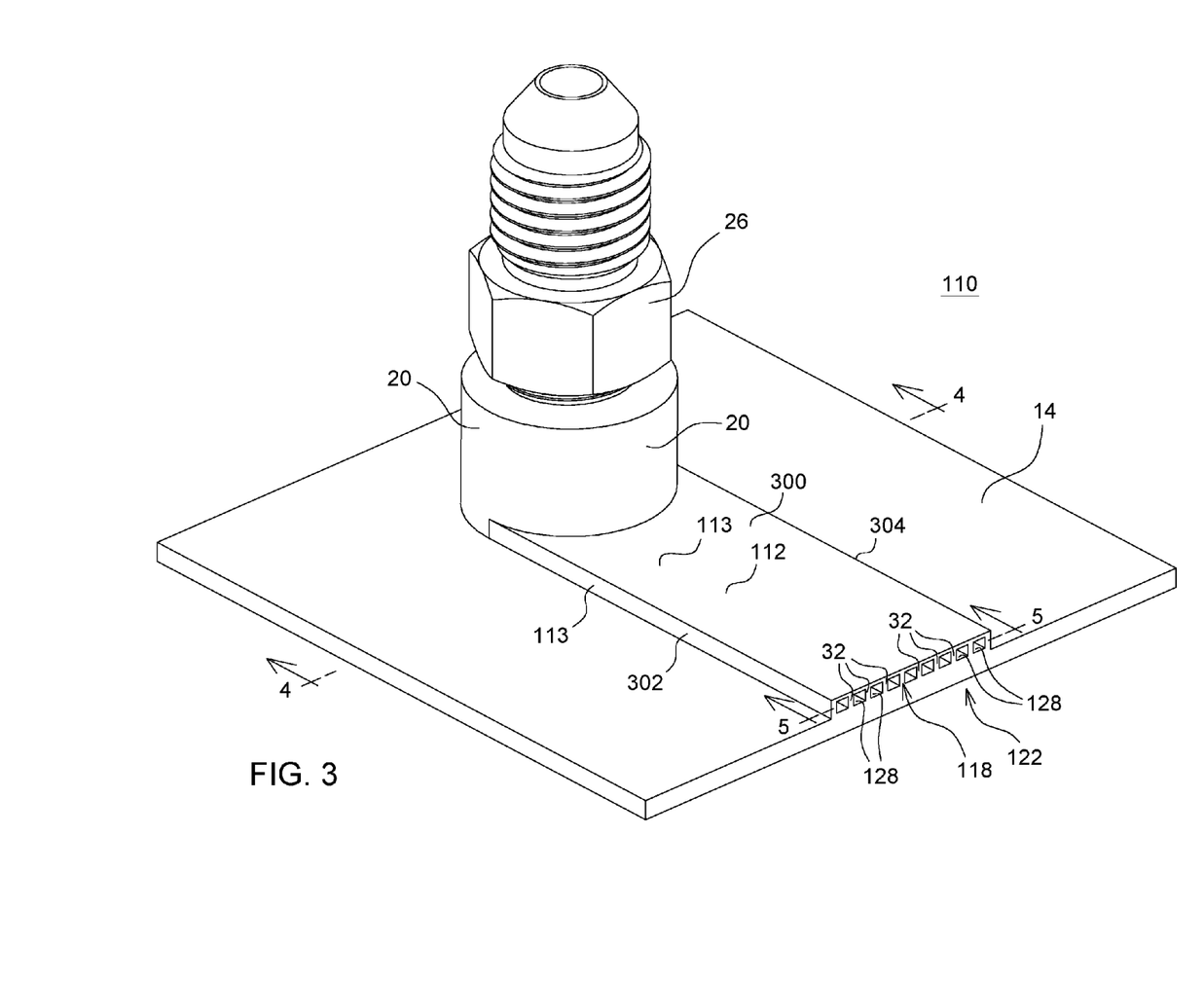
FIG. 3 is a perspective view of another embodiment of a conductive trace overlying a substrate.

FIG. 3 is a perspective view of another embodiment of a conductive trace 112 overlying a substrate. The conductive trace 112 of FIG. 3 is similar to the conductive trace 12 of FIG. 1 and FIG. 2, except the conductive trace 112 of FIG. 3 has a dielectric core 32 with metallic outer surfaces and metallic channels 28. Like reference numbers in FIG. 1 through FIG. 3, inclusive, indicate like elements.

Figure 4:
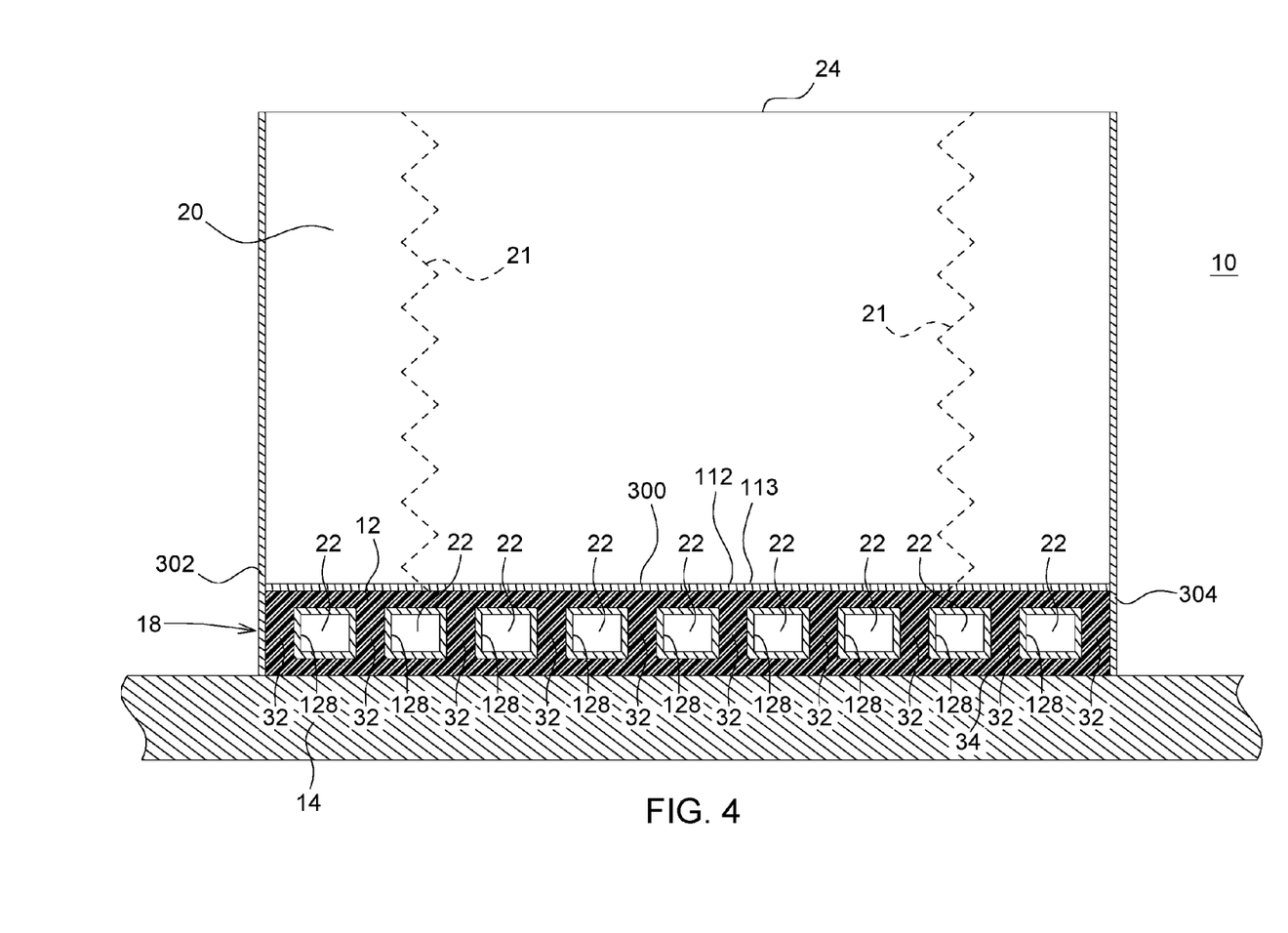
FIG. 4 is cross-sectional view of the conductive trace along reference line 4-4 of FIG. 3.
Figure 5:
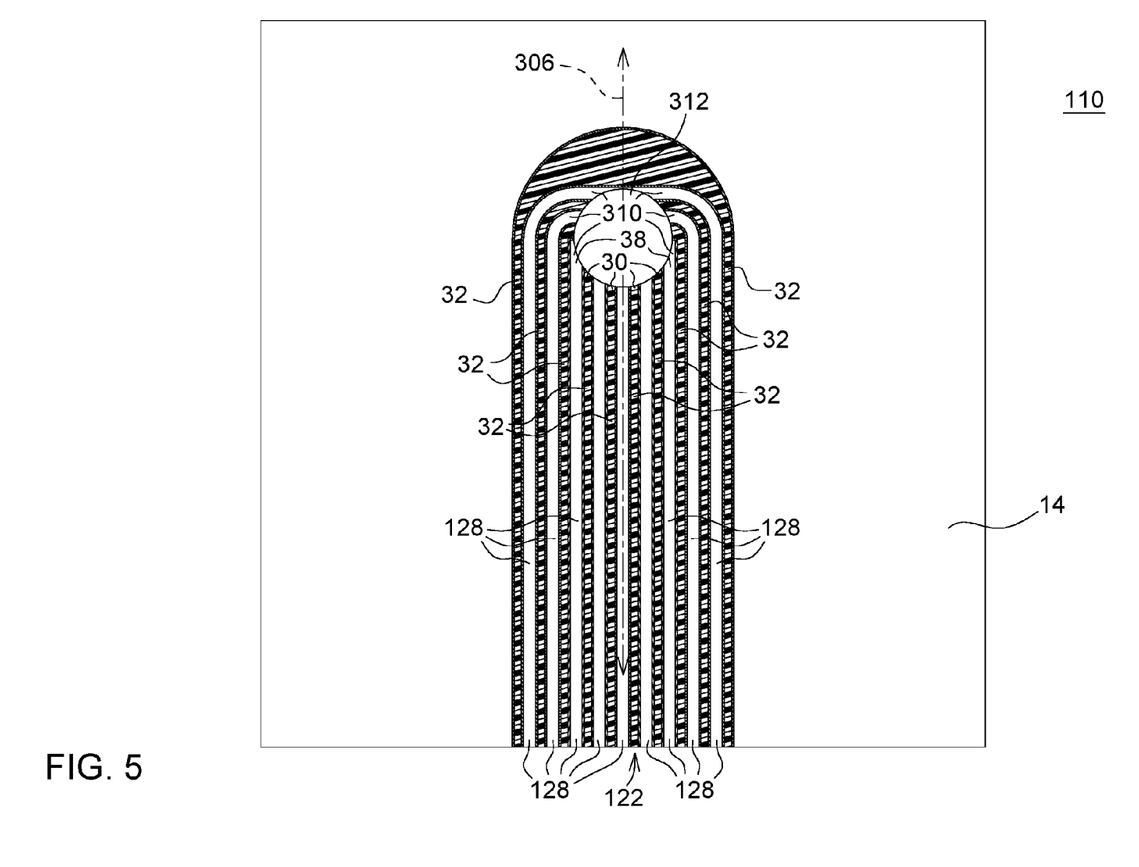
FIG. 5 is a cross-sectional view of the conductive trace along reference line 5-5 of FIG. 3.

As illustrated in FIG. 3, FIG. 4 and FIG. 5, the conductive trace 112 has metallic outer surfaces 113, such as an upper exterior surface 300 and side exterior surfaces (302, 304) of a metal or metallic material. The dielectric core 32 is bounded by a dielectric substrate 14 or dielectric layer of the circuit board and the metallic outer surfaces 113. Within the dielectric core 32, the duct 122 comprises a plurality of hollow metallic channels 128 that extend 16 longitudinally (along or parallel to a longitudinal axis 306) through an interior region or dielectric core 32 of the metallic conductive trace 112, where the channels 128 are generally parallel to each other. Each metallic channel 128 has one or more metallic walls 308. The channels 28 are capable of communicating the pressurized air or gas between the opening 24 and an opposite end 116 of the channels 128.

In one embodiment, the metallic channels 128 have a substantially rectangular cross section or a substantially polygonal cross section. In an alternate embodiment, the metallic channels 128 have substantially circular cross section or a substantially elliptical cross section. For example, the metallic channels 128 may be generally tubular.

The embodiment of FIG. 3 through FIG. 8 may use less metal or alloy than the embodiment of FIG. 1 and FIG. 2, collectively. For example, the embodiment of FIG. 3 through FIG. 7 may be used for transmission of higher frequency signals than the lower frequencies carried by FIG. 1 and FIG. 2, collectively, where higher frequency signals can be conducted by the outer metallic layer of the conductive trace 112 rather than by the interior electrically conductive portion below the surface of the conductive trace 112.

FIG. 4 is cross-sectional view of the conductive trace 112 along reference line 4-4 of FIG. 3. The hollow metallic channels 128 are separated by intervening dielectric partitions or a dielectric core 32. As illustrated in FIG. 4, each hollow metallic channel 128 has a set of walls 308, such as a bottom wall and side walls extending upward from the bottom wall, although other configurations are possible and fall within the scope of the claims of this disclosure. The walls 308 are shown in cross section.

Figure 6:
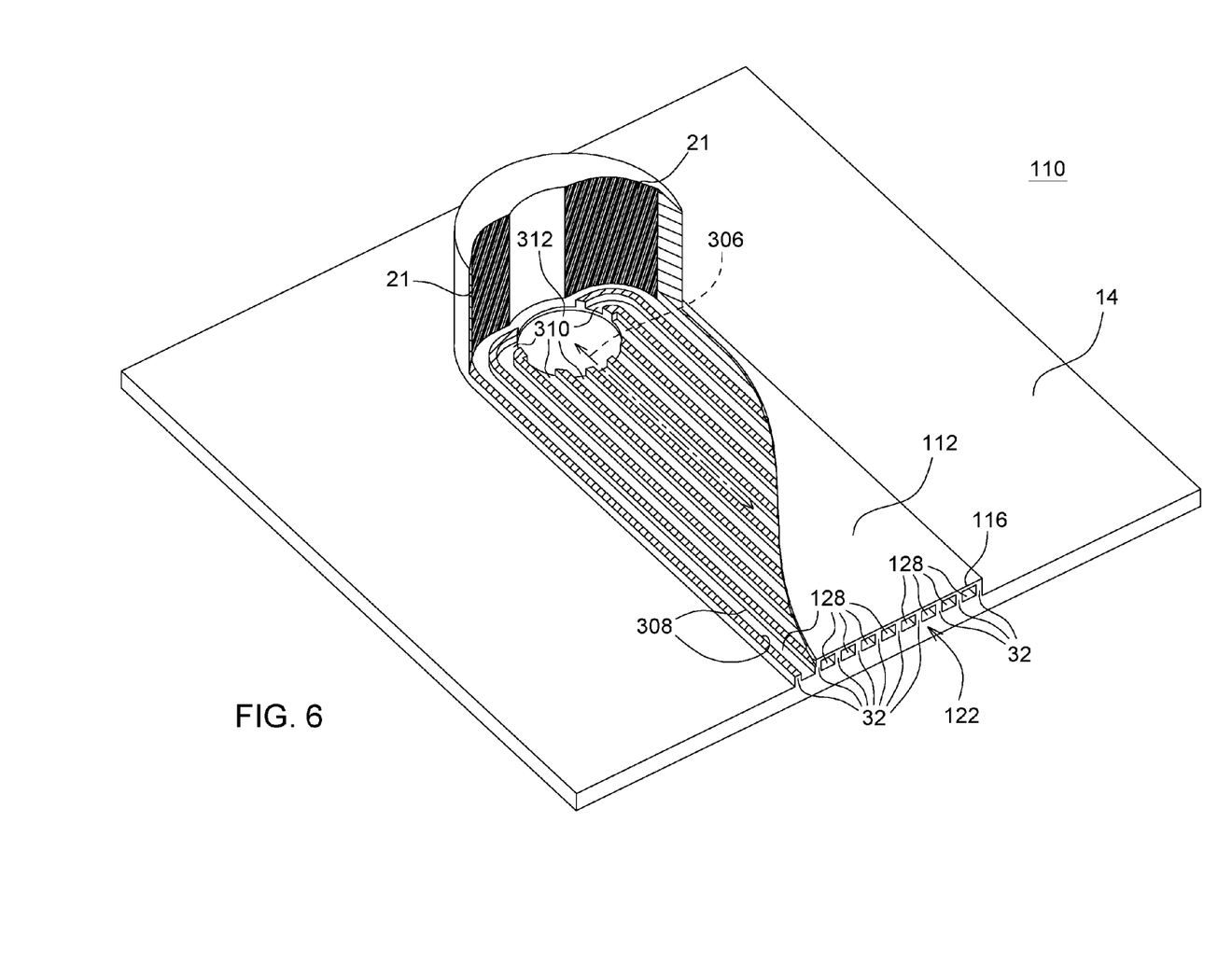
FIG. 6 is perspective view of the conductive trace of FIG. 3 with a portion cut away to reveal the cross-section.

FIG. 6 is perspective view of the conductive trace 112 of FIG. 3 with a portion cut away to reveal the cross-section 118. FIG. 5 and FIG. 6 illustrate opening 24 in annular member 20 for receiving pressurized air or gas, where the opening 24 communicates with the channels 128. The annular member 20 has a group of apertures 310 that radially separated from each other in a substantially cylindrical interior surface 21, where each aperture 310 is connected to (or open to the interior of) a respective channel 128. As shown, a bottom of the annular member 20 exposes a generally circular region 312 of the dielectric substrate 14 or layer. Accordingly, the duct 122 comprises a plurality of channels 128 that meet the opening 24 at a curved interior surface 30 of the opening 24.

Figure 7:
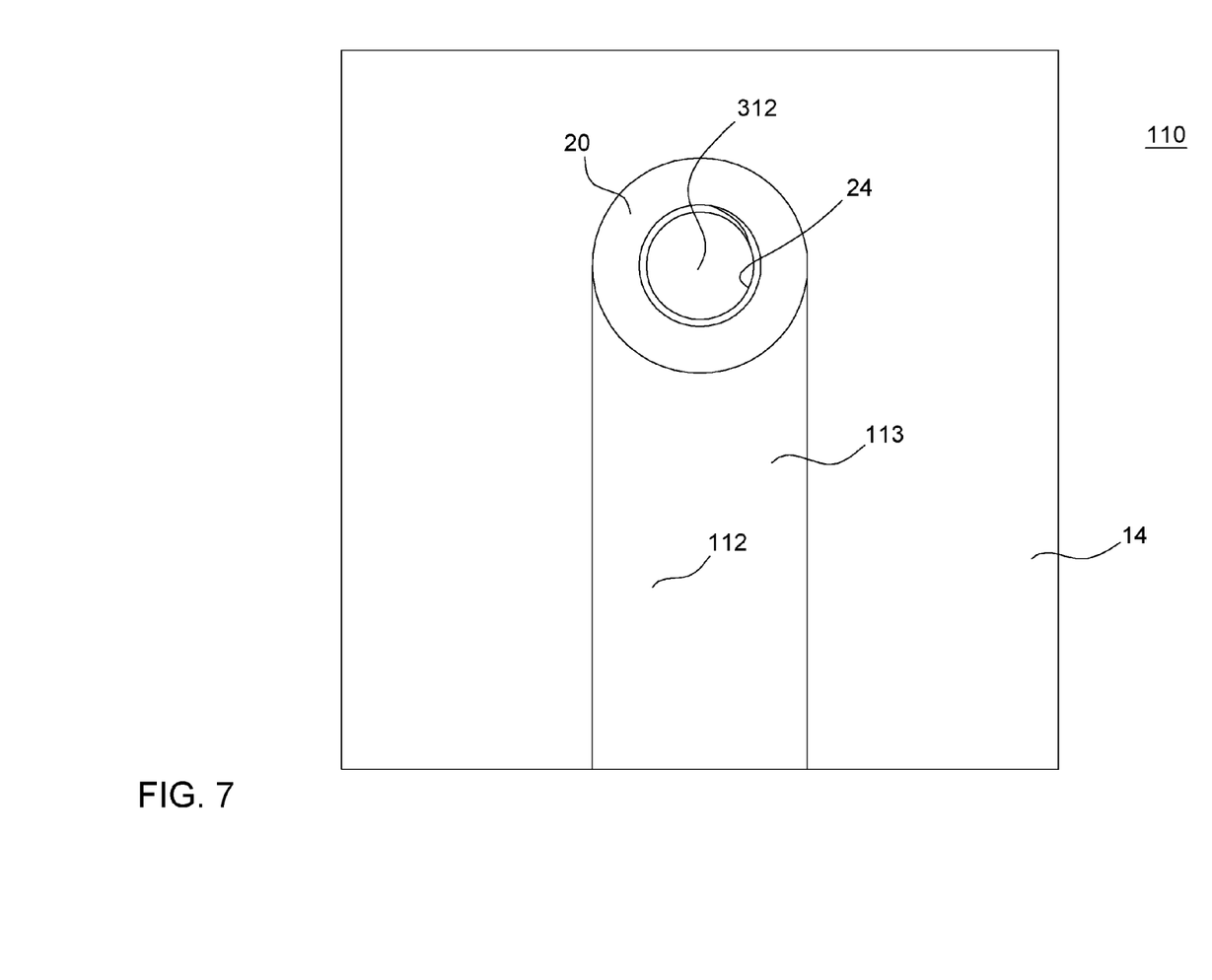
FIG. 7 is a plan view of the conductive trace of FIG. 3.

FIG. 7 is a plan view of the conductive trace 112 of FIG. 3. The opening 24 of the annular member 20 comprises a generally cylindrical hole that terminates at a surface of the dielectric substrate 14 (e.g., in the generally elliptical or circular region 312).

Figure 8:
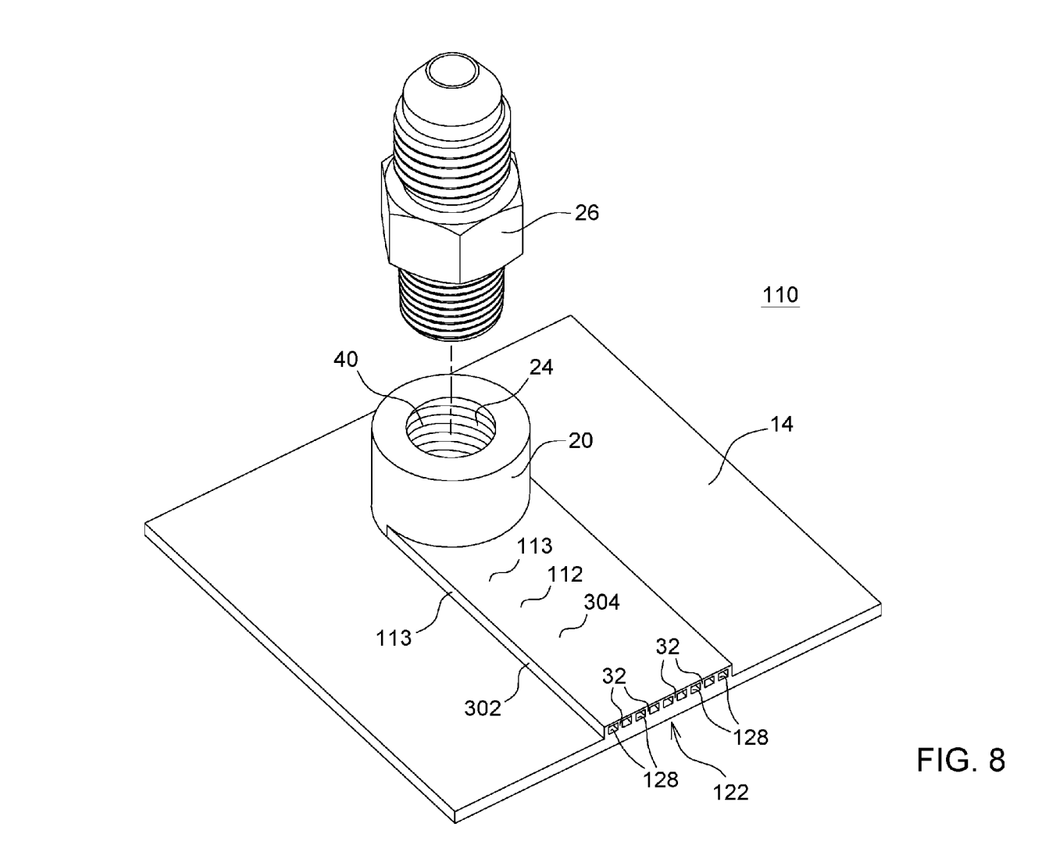
FIG. 8 is an exploded view of the conductive trace of FIG. 3 where a connector is removed.

FIG. 8 is an exploded view of the conductive trace 112 of FIG. 3 where a connector or coupler 26 is removed. As illustrated in FIG. 8, the opening 24 of the annular member 20 has internal threads 40 for receiving a coupler 26 for compressed air. Although FIG. 8 illustrates internal threads 40 in the annular member 20, in alternate embodiments the annular member 20 may have external threads for connection to a source of compressed air or gas. In one embodiment, the coupler 26 is composed of a plastic, a polymer or a dielectric material. However, in alternate embodiments the coupler 26 or connector may comprise a metal or metallic member.

The electrical assembly (110, 10) with the conductive trace (12, 112) of the disclosure is well-suited for dissipating thermal energy from circuit boards, such as circuit boards that use power electronics or that carry high currents. An air compressor can compress air, nitrogen or another gas that is forced through the channels (28, 128) to provide cooling or heat dissipation of the circuit trace (12, 112) and any associated heat-generating electrical components, like semiconductor switches, integrated circuits, or power transistors. Forced-air or forced-gas cooling is desirable because unlike liquid cooling media that can be electrically conductive, air (e.g., dry air without salt ions and marine particulate contaminants) is electrically nonconductive. Accordingly, in most non-marine operating environments, the electrical assembly (10, 110) of this disclosure eliminates or reduces the need for thick conductive traces for cooling, such as heavy copper pour traces, or a separate dedicated heatsink and the challenges to prevent coolant leakage and to provide electrical isolation that come with the liquid cooled systems. In accordance with the disclosure, the circuit trace with internal air-cooled channels (28, 128) can facilitate a cost-effective and space efficient circuit board, electrical assembly (10, 110) or electronic assembly, where one or more air-cooled conductive traces (12, 112) are capable of carrying electrical current to one or more electrical or electronic devices, such as power switching transistors, power semiconductors, or integrated circuits.

Having described the preferred embodiment, it will become apparent that various modifications can be made without departing from the scope of the invention as defined in the accompanying claims.

We claim:

1. An electrical assembly comprising:
   a dielectric substrate;
   a metallic conductive trace overlying the substrate, the metallic conductive trace having a hollow cross-section that forms a duct;
   an annular member protruding from the metallic conductive trace, the annular member having an opening in communication with the duct, the opening for receiving pressurized air or gas, wherein the duct comprises a plurality of channels that meet the opening at a curved interior surface of the opening.

2. The electrical assembly according to claim 1 wherein the hollow cross-section comprises a metallic base wall on the dielectric substrate, a plurality of side walls extending vertically from the metallic base wall, and a cap wall capping or intersecting the side walls.

3. The electrical assembly according to claim 1 wherein the plurality of channels extend longitudinally through the metallic conductive trace, where the channels are generally parallel to each other.

4. The electrical assembly according to claim 3 wherein the channels are capable of communicating the pressurized air or gas between the opening and an opposite end of the channels.

5. The electrical assembly according to claim 3 wherein the channels have a rectangular cross section, a polygonal cross section, a circular cross section or an elliptical cross section.

6. The electrical assembly according to claim 1 wherein the opening of the annular member has internal threads for receiving a coupler for compressed air.

7. The electrical assembly according to claim 6 wherein the coupler is composed of a plastic, a polymer or a dielectric material.

8. The electrical assembly according to claim 6 wherein the opening of the annular member comprises a generally cylindrical hole that terminates at a surface of the dielectric substrate.

9. The electrical assembly according to claim 1 wherein the annular member is metallic or has a metallic outer coating.

10. The electrical assembly according to claim 1 wherein the conductive trace has metallic outer surfaces, the metallic outer surfaces comprising an upper exterior surface and side exterior surfaces of a metal or metallic material.

11. An electrical assembly comprising:
    a dielectric substrate;
    a metallic conductive trace overlying the substrate, the metallic conductive trace having a hollow cross-section that forms a duct, the conductive trace having metallic outer surfaces, the metallic outer surfaces comprising an upper exterior surface and side exterior surfaces of a metal or metallic material;
    a dielectric core within the conductive trace, wherein the dielectric core is bounded by a dielectric layer of the circuit board and the metallic outer surfaces; and
    an annular member protruding from the metallic conductive trace, the annular member having an opening in communication with the duct, the opening for receiving pressurized air or gas.

12. The electrical assembly according to claim 11 wherein within the dielectric core, the duct comprises a plurality of hollow metallic channels that extend longitudinally through the metallic conductive trace, where the channels are generally parallel to each other.

13. The electrical assembly according to claim 11 wherein the hollow cross-section comprises a metallic base wall on the dielectric substrate, a plurality of side walls extending vertically from the metallic base wall, and a cap wall capping or intersecting the side walls.

14. The electrical assembly according to claim 11 wherein the duct comprises a plurality of channels that extend longitudinally through the metallic conductive trace, where the channels are generally parallel to each other.

15. The electrical assembly according to claim 14 wherein the channels are capable of communicating the pressurized air or gas between the opening and an opposite end of the channels.

16. The electrical assembly according to claim 14 wherein the channels have a rectangular cross section, a polygonal cross section, a circular cross section or an elliptical cross section.

17. The electrical assembly according to claim 11 wherein the opening of the annular member has internal threads for receiving a coupler for compressed air.

18. The electrical assembly according to claim 17 wherein the coupler is composed of a plastic, a polymer or a dielectric material.

19. The electrical assembly according to claim 17 wherein the opening of the annular member comprises a generally cylindrical hole that terminates at a surface of the dielectric substrate.

* * * * *